United States Patent
Yuza

(10) Patent No.: US 12,033,816 B2
(45) Date of Patent: Jul. 9, 2024

(54) INPUT DEVICE

(71) Applicant: ALPS ALPINE CO., LTD., Tokyo (JP)

(72) Inventor: Shingo Yuza, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 164 days.

(21) Appl. No.: 17/741,850

(22) Filed: May 11, 2022

(65) Prior Publication Data
US 2022/0375699 A1 Nov. 24, 2022

(30) Foreign Application Priority Data
May 18, 2021 (JP) .................................. 2021-083615

(51) Int. Cl.
| | |
|---|---|
| G02B 30/56 | (2020.01) |
| F21V 8/00 | (2006.01) |
| G06F 3/042 | (2006.01) |
| H01H 3/02 | (2006.01) |

(52) U.S. Cl.
CPC ............. H01H 3/02 (2013.01); G02B 6/0076 (2013.01); G02B 30/56 (2020.01); G06F 3/042 (2013.01)

(58) Field of Classification Search
CPC ................................ G02B 30/56; G06F 3/042
See application file for complete search history.

(56) References Cited

U.S. PATENT DOCUMENTS

| | | |
|---|---|---|
| 2017/0192244 A1 | 7/2017 | Shinohara et al. |
| 2018/0284470 A1 | 10/2018 | Yamamoto et al. |
| 2021/0263612 A1* | 8/2021 | Shinohara ............. G06F 3/0421 |

FOREIGN PATENT DOCUMENTS

| | | |
|---|---|---|
| JP | 2017-107165 A | 6/2017 |
| JP | 2018-081138 A | 5/2018 |
| JP | 2019-101055 A | 6/2019 |
| WO | WO 2018/078777 A1 | 5/2018 |
| WO | WO 2020/012711 A1 | 1/2020 |
| WO | WO 2020/075456 A1 | 4/2020 |

OTHER PUBLICATIONS

Extended European Search Report for European Patent Application No. 22172270.5 dated Oct. 14, 2022, 12 pages.

* cited by examiner

*Primary Examiner* — Sean P Gramling
(74) *Attorney, Agent, or Firm* — Crowell & Moring LLP

(57) ABSTRACT

An input device includes a display unit that displays an aerial image, and a detection unit that detects a user operation related to the aerial image. The display unit includes a light guide plate disposed between a half mirror and a retroreflective plate and a light source irradiating the light guide plate. The display unit displays the aerial image of a light diffusion surface formed on the light guide plate in response to incident light. When the user operation related to the aerial image is detected, the display unit turns off the light source to notify a user of input confirmation.

16 Claims, 6 Drawing Sheets

INPUT DEVICE

RELATED APPLICATIONS

The present application claims priority to Japanese Patent Application Number 2021-083615, filed May 18, 2021, the entirety of which is hereby incorporated by reference.

BACKGROUND

Field

The present disclosure relates to an input device, and particularly to an input device capable of performing an input operation by displaying an aerial image by retro-reflection.

Description of the Related Art

Aerial imaging by retro-reflection (AIRR) is known (for example, JP 2017-107165 A, JP 2018-81138 A, and JP 2019-101055 A). For example, an aerial image display device of JP 2019-101055 A discloses a structure in which a display and a retroreflective member are disposed parallel to a beam splitter, and a deflection optical element is disposed on the display in order to reduce a thickness of the device.

SUMMARY

Non-contact buttons have been rapidly expanded as input functions required for elevators and the like. FIG. 1 is an example of an input device 10 provided in an elevator, and buttons 12 configured to input floor numbers and buttons 14 configured to input opening and closing of a door are mounted thereon. The buttons 12 and 14 incorporate miniaturized non-contact sensors, respectively, so that actions of a user such as approach and placement of a hand or finger with respect to the buttons 12 and 14 is detected. In addition, in a case where an aerial image 16 is displayed above the buttons 12 and 14 using retro-reflection, the non-contact sensor detects the actions of the user such as the approach of the hand or finger and the placement of the hand or finger with respect to the aerial image 16.

In a case where an input operation of the user is detected by the non-contact sensor, the user can perform the input in a non-contact manner. However there is a problem in that it is difficult to ascertain whether or not the input has been confirmed when the user places the hand or finger on the aerial image 16. In addition, in a case where the aerial image of the button is displayed, it is desirable to achieve a reduction in thickness of the input device.

The present disclosure solves such problems, and an object thereof is to provide an input device capable of notifying input confirmation and achieving a reduction in thickness.

An input device according to the present disclosure includes a display unit having a light guide plate disposed between a beam splitter and a retroreflective member and a light source irradiating the light guide plate. The display unit displays an aerial image of a light diffusion surface formed on the light guide plate in response to incident light. A detection unit detects a user operation related to the aerial image, and the display unit switches on and off the light source based on a detection result of the detection unit.

In one aspect, the detection unit detects pressing of the display unit as the user operation. In another aspect, the detection unit includes an open/close switch to detect the pressing of the display unit. In another aspect, when the user operation is detected, the display unit turns off the light source and causes the aerial image not to be displayed. In another aspect, the light guide plate includes first and second light guide plates which are stacked, the light source includes first and second light sources respectively corresponding to the first and second light guide plates, and the display unit turns on one of the first and second light sources and turns off another of the first and second light sources based on the detection result of the detection unit. In another aspect, the second light guide plate is farther from the beam splitter than the first light guide plate, and the display unit turns off the first light source and turns on the second light source to display a second aerial image, and, when a user operation related to the second aerial image using the second light guide plate is detected, turns off the second light source and turns on the first light source to display a first aerial image using the first light guide plate. In another aspect, the first aerial image using the first light guide plate is smaller than the second aerial image using the second light guide plate. In another aspect, a color of light emitted from the first light source is different from a color of light emitted from the second light source. In another aspect, the display unit further includes a lens whose focal length is electrically changeable, and the display unit changes the focal length of the lens based on the detection result of the detection unit. In another aspect, the display unit changes a size or a display position of the aerial image when the user operation is detected.

According to the present disclosure, the display unit switches on and off of the light source based on the detection result of the detection unit, and thus, the user can ascertain the input confirmation through the display of the aerial image. In addition, it is possible to achieve the reduction in the thickness of the input device by detecting pressing of the display unit.

DETAILED DESCRIPTION

Next, embodiments of the present disclosure will be described. An input device of the present disclosure is an input device in which a function of displaying an aerial image using retro-reflection and a function of detecting a user operation are integrated. It should be noted that the drawings referred to in the following description of the embodiments include exaggerated displays in order to facilitate understanding of the disclosure, and do not directly represent the shape and scale of an actual input device.

Embodiments

Figure 2A:
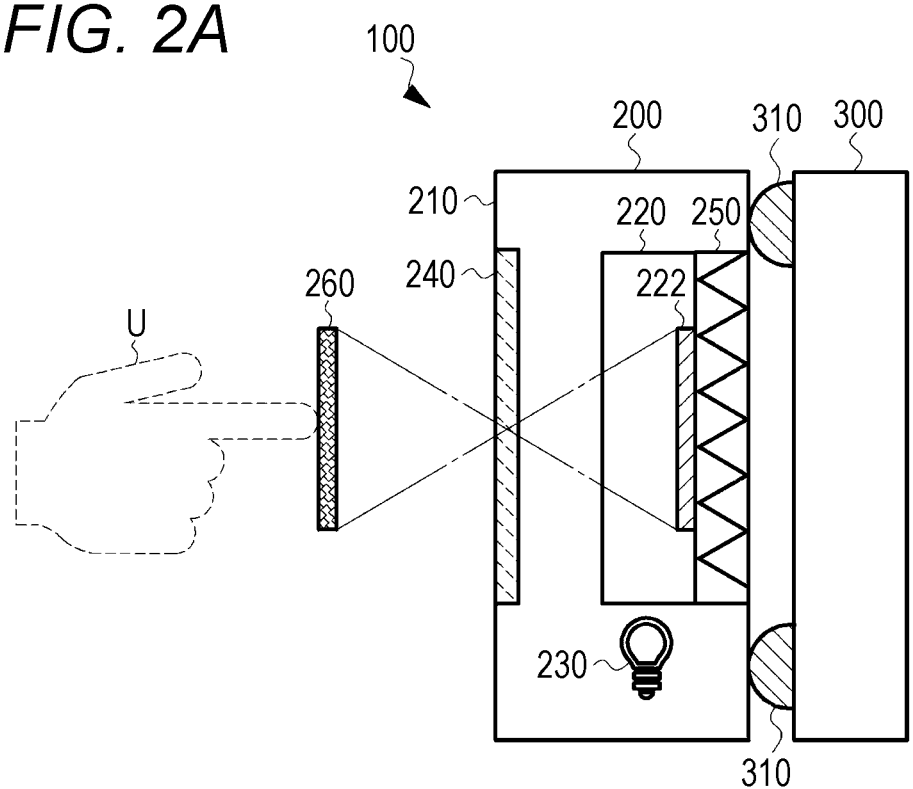
FIGS. 2A and 2B are schematic cross-sectional views illustrating configurations of an input device according to a first embodiment of the present disclosure.
Figure 2B:
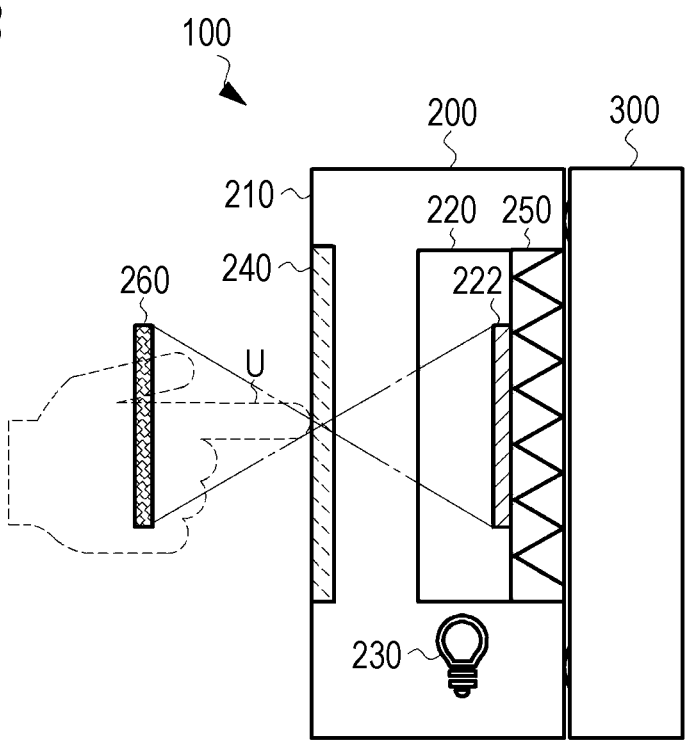

Next, an embodiment of the present disclosure will be described in detail. FIGS. 2A and 2B are schematic cross-sectional views illustrating a configuration of an input device according to a first embodiment of the present disclosure. An input device 100 of the present embodiment includes a display unit 200 having a function of displaying an aerial image, and a detection unit 300 having a function of detecting a user operation related to the aerial image displayed by the display unit 200.

The display unit 200 includes, for example, a light guide plate 220, a light source 230, a half mirror 240, and a retroreflective plate 250 in a rectangular housing 210 in which a space is formed.

Figure 1:
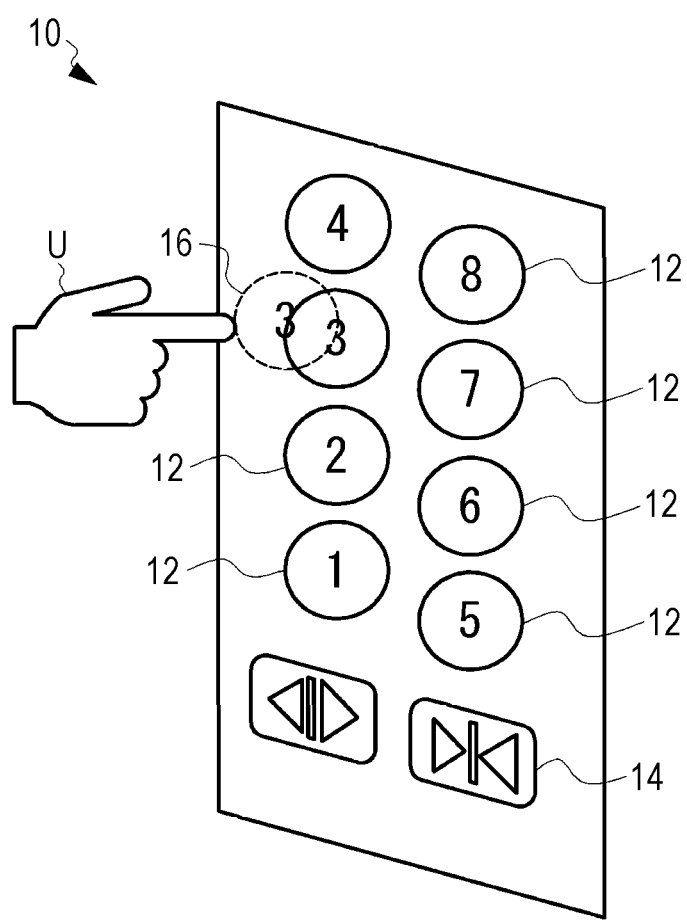
FIG. 1 is a view illustrating an example of an input device mounted on a conventional elevator.

The light guide plate 220 is a transparent plate-like or film-like optical member including a flat upper surface, a flat bottom surface, and side surfaces connecting the upper surface and the bottom surface. A known plate can be used as the light guide plate 220, and may be made of, for example, glass, acrylic plastic, a polycarbonate resin, a cycloolefin-based resin, or the like. A light diffusion surface 222 is formed on the bottom or bottom surface of the light guide plate 220. The light diffusion surface 222 is formed, for example, by performing laser processing or printing processing on the bottom surface of the light guide plate 220. The light diffusion surface 222 forms a design that is an original image to generate the aerial image. The design is, for example, a number representing a floor number of an input button 12 as illustrated in FIG. 1.

The light source 230 is disposed on a side portion of the light guide plate 220. The light source 230 is not particularly limited, but, for example, a light emitting diode, a laser diode, or the like may be used. The light source 230 emits light having a constant emission angle (or radiation angle) toward the side portion of the light guide plate 220, and uniformly irradiates the inside of the light guide plate 220. The light diffusion surface 222 of the light guide plate 220 diffuses or scatters the incident light upward.

The half mirror 240 is disposed on the upper surface side of the light guide plate 220. The half mirror 240 is a transparent optical member which separates incident light into reflected light and transmitted light. The half mirror 240 is configured by, for example, forming a dielectric multi-layer film, an anti-reflection film, or the like on a front surface or a back surface of a substrate of such as flat glass or plastic. Here, a half mirror 240 in which the amount of the reflected light and the amount of the transmitted light are equal is exemplified. However, a beam splitter in which a ratio between the amount of reflected light and the amount of transmitted light differs depending on the luminance of the light source 230 or the luminance of the aerial image may also be used.

The retroreflective plate 250 is attached so as to be in contact with the bottom surface of the light guide plate 220. The retroreflective plate 250 is an optical member that reflects light in the same direction as the incident light and includes, for example, a prismatic retroreflective element such as a triangular pyramid retroreflective element, full cube corner retroreflective element, or beaded retroreflective element, although its configuration is not particularly limited.

The light incident from the side portion of the light guide plate 220 is diffused or scattered upward by the light diffusion surface 222, a part of the diffused or scattered light is reflected by the half mirror 240, and the reflected light thereof is incident on the retroreflective plate 250. The light incident on the retroreflective plate 250 is reflected in the same direction as the incident light, and a part thereof is transmitted through the half mirror 240 and forms an image again. As a result, an aerial image 260 floating from the display unit 200 is observed from the viewpoint of a user.

The detection unit 300 is disposed on a bottom surface side of the display unit 200. When the display unit 200 is operated by the user, the detection unit 300 detects the operation. In an aspect, the user visually recognizes the aerial image 260 displayed by the display unit 200 and presses the display unit 200 to perform input. The display unit 200 functions as an input button, and changes its position when being pressed by the user. The detection unit 300 detects a position change of the display unit 200 as the user operation.

As a specific example, the detection unit 300 includes a switch whose contact is physically or mechanically opened and closed, and the contact of the switch is opened and closed by protrusions 310 in contact with a bottom surface of a housing 210 of the display unit 200. The protrusions 310 are elastically biased to the bottom surface of the housing by an elastic member such as a spring, and the switch is opened or closed, for example, when the display unit 200 is pressed against an elastic force thereof. A result of opening and closing of the switch is provided to a controller (not illustrated) or the like.

FIG. 2A illustrates a state in which the aerial image 260 is displayed by the display unit 200 and the display unit 200 is not pressed by a user U. At this time, the protrusion 310 protrudes from the detection unit 300 and elastically biases the bottom surface of the housing 210.

FIG. 2B illustrates a state in which the user visually recognizes the aerial image 260 and presses the display unit 200. When the user U presses the display unit 200, the display unit 200 moves to the right, and the protrusions 310 are recessed inward by the movement, whereby the switch is opened and closed.

In this manner, according to the present embodiment, it is possible to reduce the thickness of the input device 100 by integrating the display unit 200 and the detection unit 300, while providing a state in which the display unit 200 can be pressed by visually recognizing the aerial image 260 in the input device 100. In addition, the user U can ascertain that the input has been confirmed by physically pressing the display unit 200.

Note that the display unit 200 that generates the aerial image is not limited to the configuration illustrated in FIGS. 2A and 2B, and for example, the half mirror 240 may be changed to a polarization beam splitter, and a $\lambda/4$ plate may be inserted between the light guide plate 220 and the retroreflective plate 250. As a result, the aerial image 260 can be displayed using polarized light.

Figure 3A:
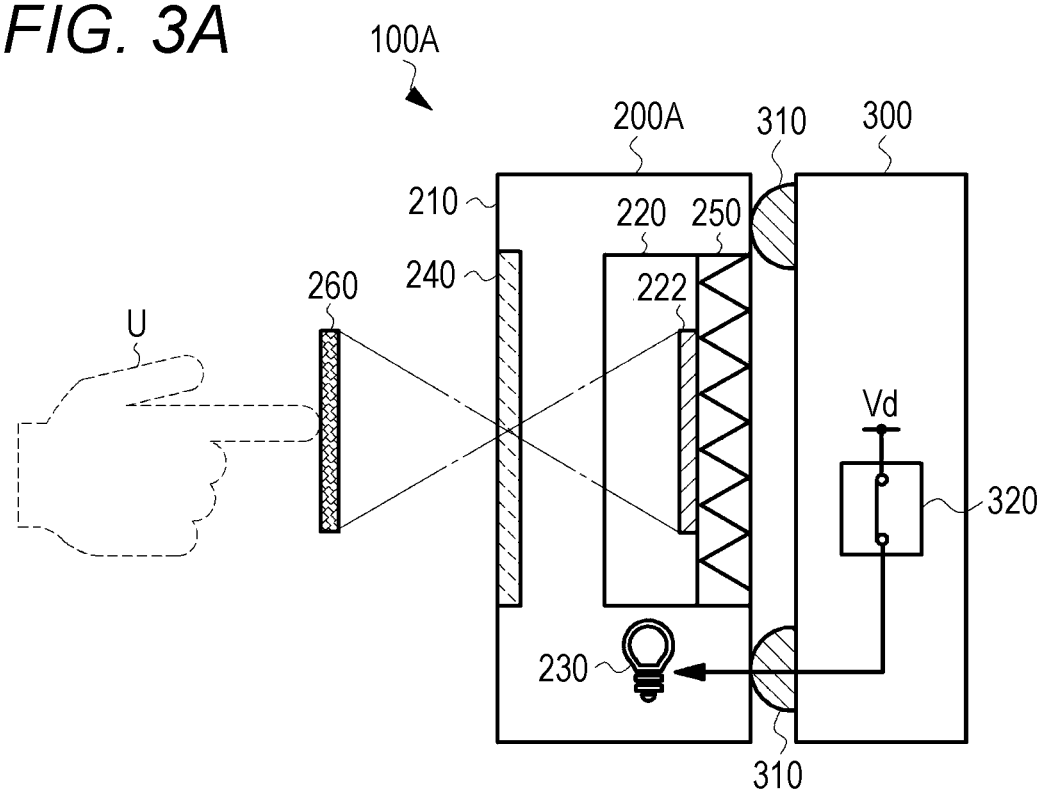
FIGS. 3A and 3B are schematic cross-sectional views illustrating configurations of an input device according to a second embodiment of the present disclosure.
Figure 3B:
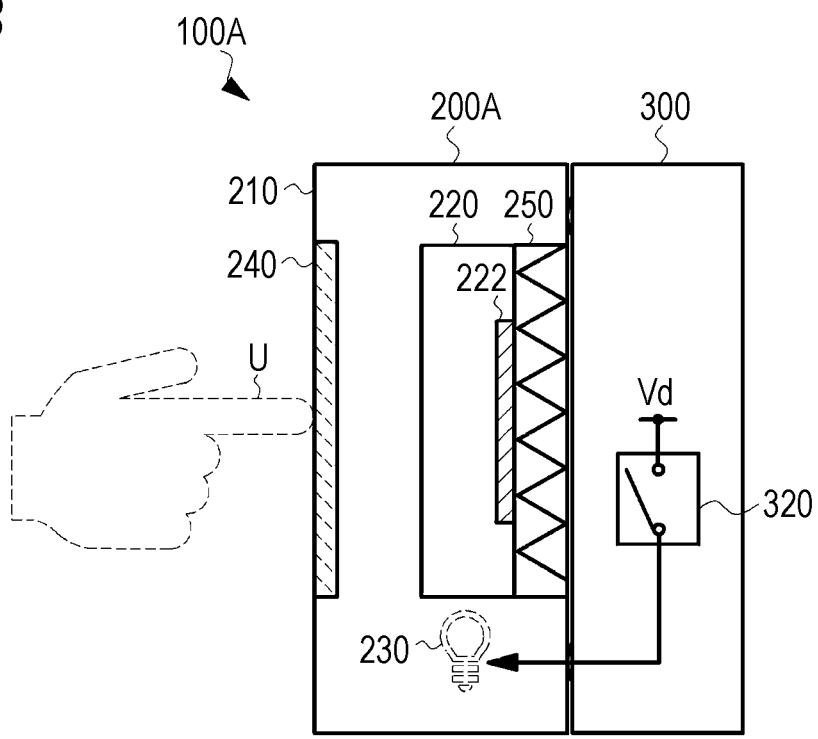

Next, a second embodiment of the present disclosure will be described. FIGS. 3A and 3B are views illustrating configurations of an input device 100A according to the second embodiment, and the same elements as those in FIGS. 2A and 2B are denoted by the same reference signs. In the present embodiment, a detection unit 300 provides a detection result of a user operation to a display unit 200A, and the display unit 200A switches on and off of a light source 230 according to the detection result.

The detection unit 300 includes a switch 320 that is opened and closed depending on positions of protrusions 310, which is similar to the first embodiment. For example, the switch 320 is configured to be closed when the display unit 200A is not pressed by a user U as illustrated in FIG. 3A, and to be opened when the display unit 200A is pressed by the user U as illustrated in FIG. 3B. The switch 320 provides a voltage signal Vd to the display unit 200A when the switch 320 is closed, and provides a signal at the GND level to the display unit 200A when the switch 320 is opened. In one example, the protrusions 310 may be made of a conductive material, and signals indicating opening and closing of the switch 320 may be provided to the display unit 200A using one of the protrusions 310 as a part of a current path.

When the display unit 200A is not pressed by the user U, as illustrated in FIG. 3A, the display unit 200A turns on the light source 230 based on the voltage signal Vd to display an aerial image 260. On the other hand, when the display unit 200A is pressed by the user U, as illustrated in FIG. 3B, the display unit 200A turns off the light source 230 based on the signal at the GND level, to not display the aerial image 260. Since the aerial image 260 is not displayed in synchronization with the pressing of the display unit 200A, the user can visually recognize that the input has been confirmed.

In this manner, according to the present embodiment, it is possible to notify the user of the input confirmation by switching on and off of the light source 230 depending on the detection result of the user operation to perform display and non-display of the aerial image 260. In addition, it is possible to achieve a reduction in thickness of the input device since the pressing of the display unit 200A is detected (the amount of pressing may be small).

Figure 4A:
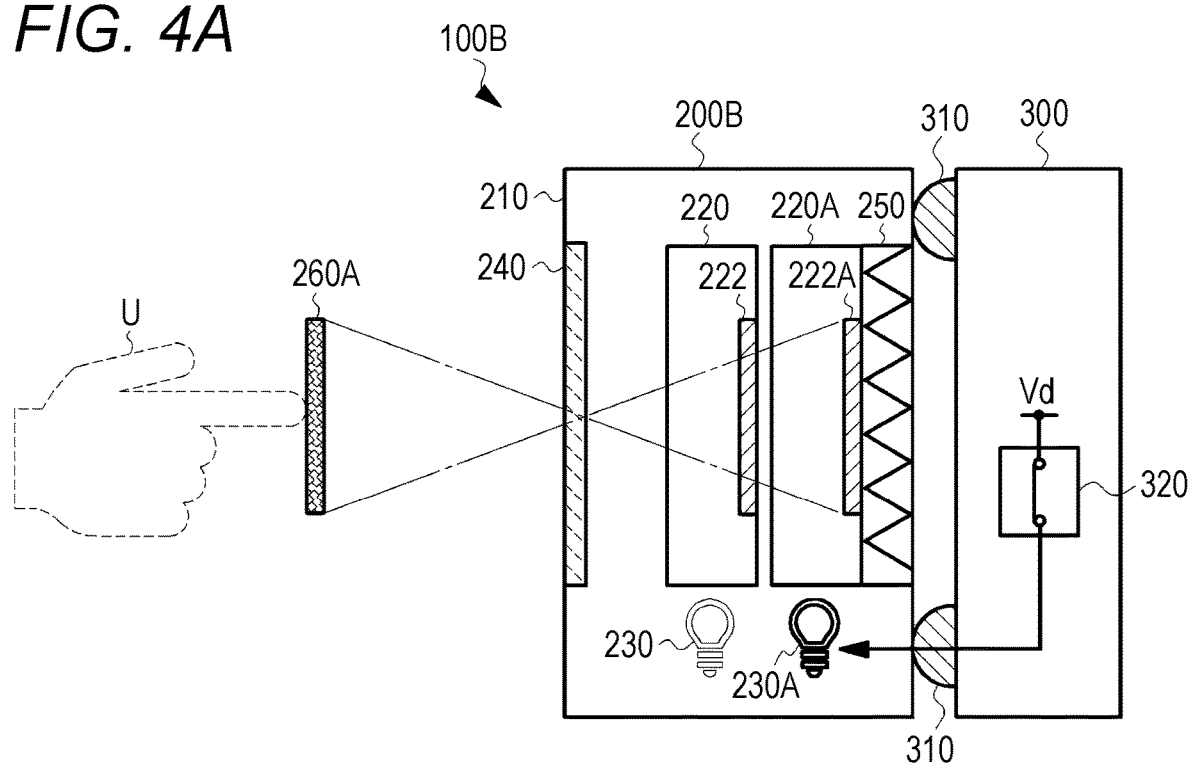
FIGS. 4A and 4B are schematic cross-sectional views illustrating configurations of an input device according to a third embodiment of the present disclosure.
Figure 4B:
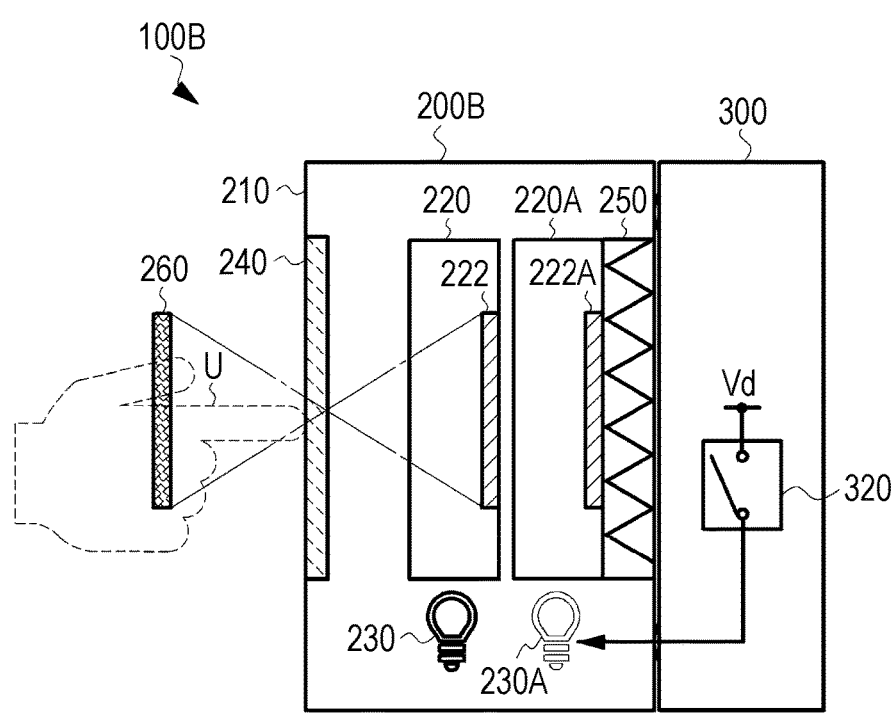

Next, a third embodiment of the present disclosure will be described. FIGS. 4A and 4B are views illustrating configurations of an input device 100B according to the third embodiment, and the same elements as those in FIGS. 2A to 3B are denoted by the same reference signs.

A display unit 200B of the present embodiment includes two stacked light guide plates 220 and 220A. The two light guide plates 220 and 220A may have the same configuration. The designs of light diffusion surfaces 222 and 222A may be different from each other. In addition, two light sources 230 and 230A are provided so as to correspond to the two light guide plates 220 and 220A. The two light sources 230 and 230A may have the same configuration or may emit beams of light of different wavelengths (colors), respectively.

The light guide plate 220A is disposed on a bottom surface side of the light guide plate 220, and a retroreflective plate 250 is disposed on a bottom surface side of the light guide plate 220A. The display unit 200B turns on any one of the light sources 230 and 230A, thereby displaying aerial images 260 and 260A by any one of the light guide plates 220 and 220A. As a preferable aspect, the display unit 200B turns off the light source 230 and turns on the light source 230A to irradiate the light guide plate 220A, as illustrated in FIG. 4A. Light diffused or scattered by the light diffusion surface 222A of the light guide plate 220A is transmitted through the light guide plate 220, is partially reflected by a half mirror 240, and the reflected light thereof enters the retroreflective plate 250 via the light guide plates 220 and 220A. The retroreflective plate 250 reflects light in the same direction as the incident light, the reflected light thereof is transmitted through the light guide plates 220A and 220, and a part of the transmitted light is transmitted through the half mirror 240. In this manner, the aerial image 260A using the light guide plate 220A is displayed. The aerial image 260A is generated at a line-symmetric position with respect to the half mirror 240, and thus, the aerial image 260A is displayed so as to float relatively high or far from the display unit 200B.

When a user U visually recognizes the aerial image 260A and presses the display unit 200B as a user operation, such pressing is detected by a detection unit 300, and a detection result is provided to the display unit 200B. A state at this time is illustrated in FIG. 4B. When the pressing of the user is detected by the detection unit 300, the display unit 200B turns on the light source 230 and turns off the light source 230A to irradiate the light guide plate 220. Light diffused or scattered by the light diffusion surface 222 of the light guide plate 220 is partially reflected by the half mirror 240, and the reflected light thereof enters the retroreflective plate 250 via the light guide plates 220 and 220A. The retroreflective plate 250 reflects light in the same direction as the incident light, the reflected light thereof is transmitted through the light guide plates 220A and 220, and a part of the transmitted light is transmitted through the half mirror 240. In this manner, the aerial image 260 using the light guide plate 220 is displayed. The aerial image 260 has a lower or closer floating height than the aerial image 260A.

In this manner, the user can ascertain input confirmation by visually recognizing that a display position of the aerial image changes in synchronization with the user operation according to the present embodiment. Note that a size or a shape of the light diffusion surface 222 of the light guide plate 220 may be different from that of the light diffusion surface 222A of the light guide plate 220A. In this case, the user can ascertain the input confirmation based on a change in size or shape of the aerial image 260. Furthermore, colors of the light source 230 and the light source 230A may be changed. In this case, the user can ascertain the input confirmation based on a change in color of the aerial image 260.

Figure 5A:
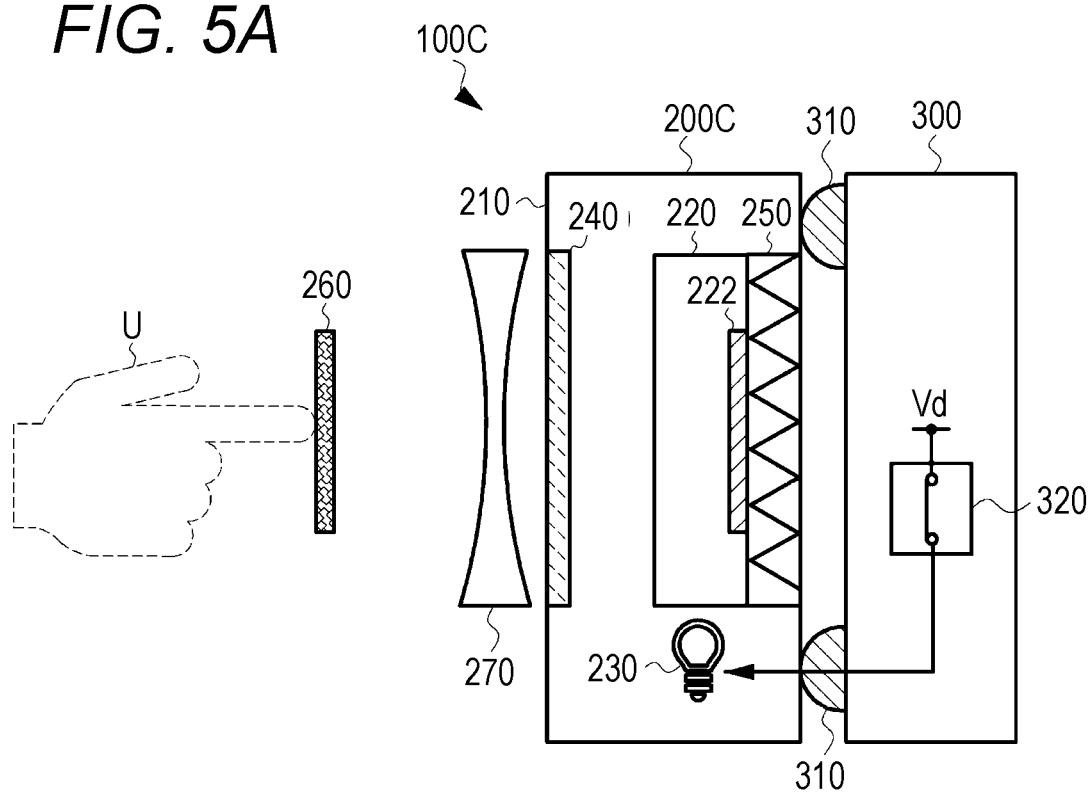
FIGS. 5A and 5B are schematic cross-sectional views illustrating configurations of an input device according to a fourth embodiment of the present disclosure.
Figure 5B:
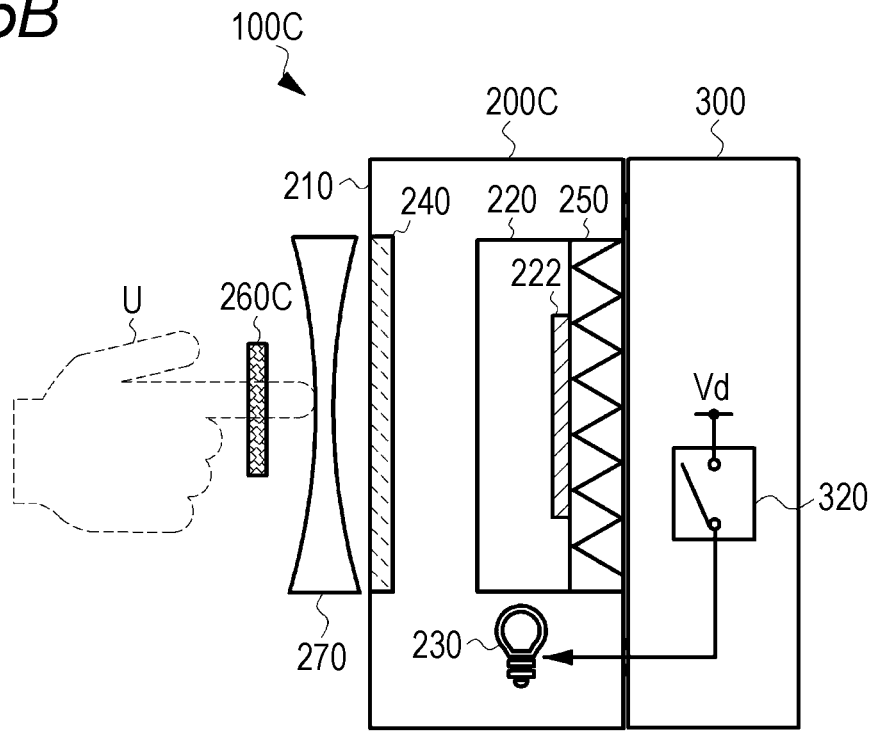

Next, a fourth embodiment of the present disclosure will be described. FIGS. 5A and 5B are views illustrating configurations of an input device 100C according to the fourth embodiment, and the same elements as those in FIGS. 2A to 3B are denoted by the same reference signs. A display unit 200C of the present embodiment includes an electron lens 270 in front of a half mirror 240 in addition to the configurations of the display unit 200A of the second embodiment. The electron lens 270 is a concave lens or a convex lens whose focal length can be electrically changed. For example, the electron lens 270 is configured using a liquid crystal lens. In addition, a protective glass or the like may be disposed on the surface of the electron lens 270 in order to protect the electron lens 270 from a user operation.

A detection unit 300 detects pressing of the display unit 200C and provides a detection result to the display unit 200C, which is similar to the above-described embodiments. The display unit 200C changes the focal length of the electron lens 270 depending on the detection result, thereby changing a display position (hover height) and a dimension (size) of an aerial image.

FIG. 5A illustrates a state in which pressing by a user U is not performed. At this time, the display unit 200C adjusts the focal length of the electron lens 270, and causes an aerial image 260 to be displayed so as to float relatively far from the display unit 200C.

FIG. 5B illustrates a state in which the pressing by the user U is performed. The display unit 200C adjusts the focal length of the electron lens 270 such that an aerial image 260C is displayed at a position relatively close to the display unit 200C with a small size, in response to the detection of the pressing of the display unit 200C by the detection unit 300.

In this manner, according to the present embodiment, the user can ascertain input confirmation by visually recognizing that changes in the hover height and the size of the aerial image in synchronization with the user operation.

Figure 6A:
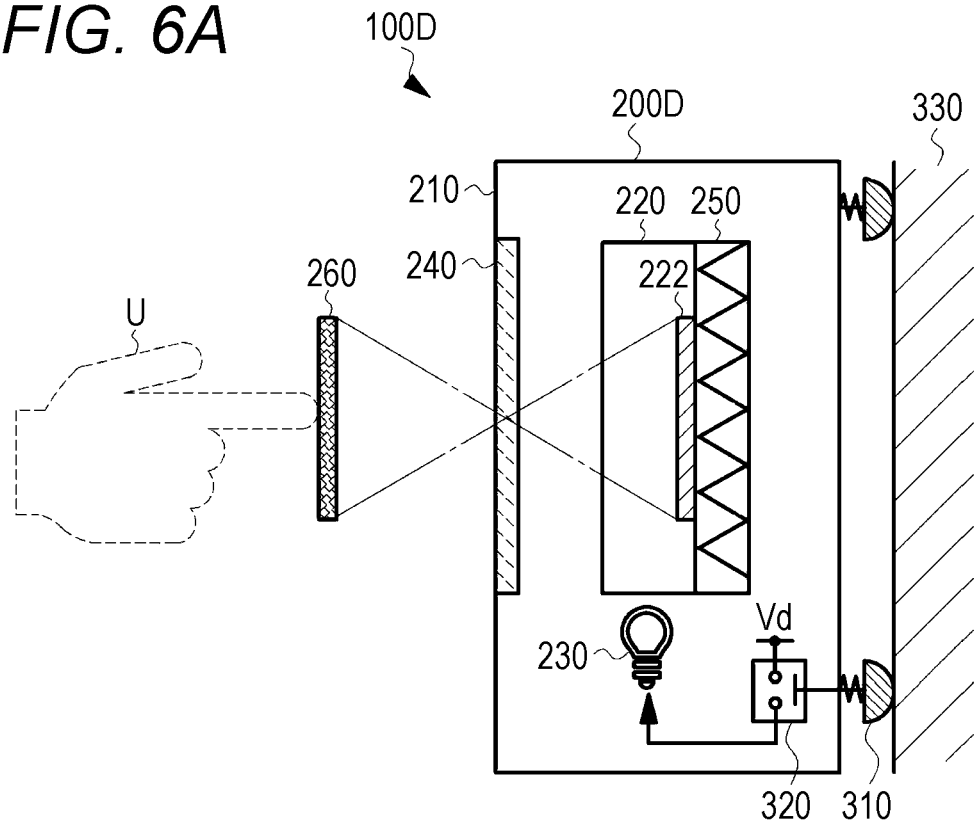
FIGS. 6A and 6B are schematic cross-sectional views illustrating configurations of an input device according to a modification of the present disclosure.
Figure 6B:
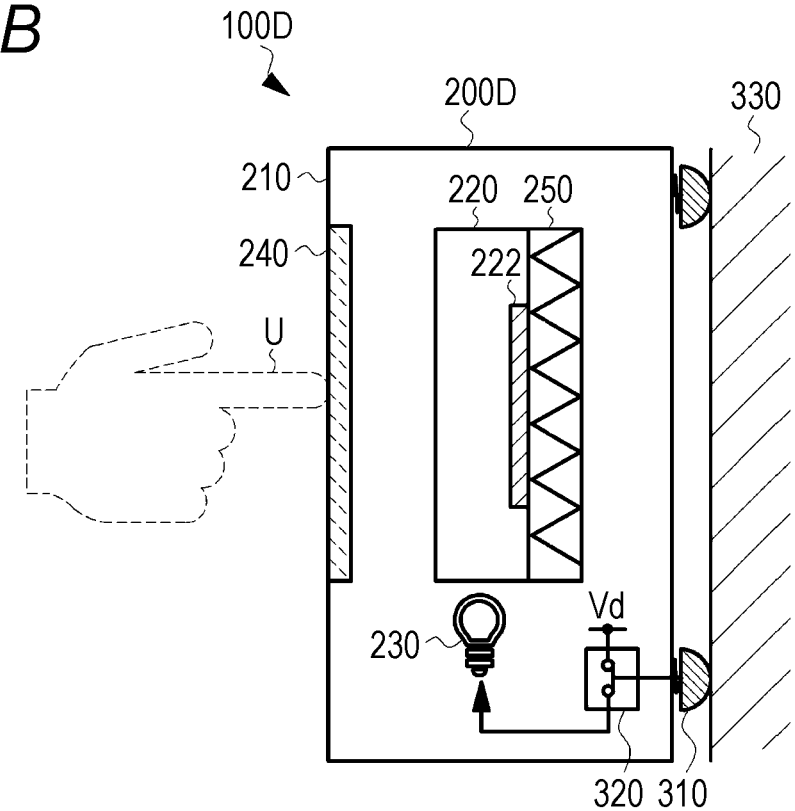

Although the switch 320, whose contact is opened and closed by the movement of the protrusions 310 is exemplified as the detection unit 300 in the above-described embodiments, the detection unit 300 is not necessarily limited to such a switch, and may be a switch having another configuration. For example, as illustrated in FIG. 6A, a switch 320 as a detection unit 300 may be constructed in a housing 210 of a display unit 200D, and protrusions 310 may protrude from a bottom surface of the housing 210. In this case, the protrusions 310 may protrude to open the switch 320 when the display unit 200D is not pressed, as illustrated in FIG. 6A. The protrusions 310 may contact with a stationary member 330 and become recessed to close the switch 320 when the display unit 200D is pressed, as illustrated in FIG. 6B. The display unit 200D switches on and off of a light source 230 depending on the opening and closing of the switch 320. With such a configuration, an input device 100D can be further reduced in thickness.

A spatial input device of the present example can be applied to any user input, and can be applied to, for example, a computer device, an in-vehicle electronic device, an ATM of a bank or the like, a ticket purchasing machine of a station or the like, an input button of an elevator, and the like.

Although there has been illustrated and described what is at present contemplated to be preferred embodiments of the present disclosure, it will be understood by those skilled in the art that various changes and modifications may be made, and equivalents may be substituted for elements thereof without departing from the true scope of the disclosure. In addition, many modifications may be made to adapt a particular situation to the teachings of the disclosure without departing from the central scope thereof. Therefore, it is intended that this disclosure not be limited to the particular embodiments disclosed, but that the disclosure will include all embodiments falling within the scope of the appended claims.

What is claimed is:

1. An input device comprising:
a display unit that includes a light guide plate disposed between a beam splitter and a retroreflective member and a light source irradiating the light guide plate, wherein the display unit displays an aerial image of a light diffusion surface formed on the light guide plate in response to incident light; and,
a detection unit that detects a user operation related to the aerial image,
wherein the display unit switches on and off the light source based on a detection result of the detection unit; and,
wherein the detection unit detects pressing of the display unit as the user operation.

2. The input device according to claim 1, wherein the detection unit includes an open/close switch to detect the pressing of the display unit.

3. The input device according to claim 2, wherein the display unit turns off the light source to not display the aerial image when the user operation is detected.

4. The input device according to claim 2, wherein the light guide plate includes first and second light guide plates which are stacked, and the light source includes first and second light sources respectively corresponding to the first and second light guide plates, and
the display unit turns on one of the first and second light sources and turns off another of the first and second light sources based on the detection result of the detection unit.

5. The input device according to claim 4, wherein the second light guide plate is farther from the beam splitter than the first light guide plate, and
the display unit turns off the first light source and turns on the second light source to display a second aerial image, and, when a user operation related to the second aerial image using the second light guide plate is detected, turns off the second light source and turns on the first light source to display a first aerial image using the first light guide plate.

6. The input device according to claim 5, wherein the first aerial image using the first light guide plate is smaller than the second aerial image using the second light guide plate.

7. The input device according to claim 5, wherein a color of light emitted from the first light source is different from a color of light emitted from the second light source.

8. The input device according to claim 2, wherein the display unit further includes a lens whose focal length is electrically changeable, and
the display unit changes the focal length of the lens based on the detection result of the detection unit.

9. The input device according to claim 8, wherein the display unit changes a size or a display position of the aerial image when the user operation is detected.

10. The input device according to claim 1, wherein the display unit turns off the light source to not display the aerial image when the user operation is detected.

11. The input device according to claim 10, wherein the light guide plate includes first and second light guide plates which are stacked, and the light source includes first and second light sources respectively corresponding to the first and second light guide plates, and
the display unit turns on one of the first and second light sources and turns off another of the first and second light sources based on the detection result of the detection unit.

12. An input device comprising:
a display that includes a light guide plate disposed between a beam splitter and a retroreflective member and a light source irradiating the light guide plate, wherein the display projects an aerial image of a light diffusion surface formed on the light guide plate in response to incident light; and,
a switch that detects a user operation related to the aerial image,
wherein the display switches on and off the light source based on a detection result of the switch; and,
wherein the switch detects pressing of the display as the user operation.

13. The input device according to claim 12, wherein the display turns off the light source to not display the aerial image when the user operation is detected.

14. The input device according to claim 12, wherein the light guide plate includes first and second light guide plates which are stacked, and the light source includes first and second light sources respectively corresponding to the first and second light guide plates, and the display turns on one of the first and second light sources and turns off another of the first and second light sources based on the detection result of the switch.

15. The input device according to claim 14, wherein
the second light guide plate is farther from the beam splitter than the first light guide plate, and
the display turns off the first light source and turns on the second light source to display a second aerial image, and, when a user operation related to the second aerial image using the second light guide plate is detected, turns off the second light source and turns on the first light source to display a first aerial image using the first light guide plate.

16. The input device according to claim 15, wherein
the first aerial image using the first light guide plate is smaller than the second aerial image using the second light guide plate.

* * * * *